United States Patent [19]
Cline et al.

[11] 3,988,760
[45] Oct. 26, 1976

[54] DEEP DIODE BILATERAL SEMICONDUCTOR SWITCH

[75] Inventors: Harvey E. Cline; Thomas R. Anthony, both of Schenectady, N.Y.

[73] Assignee: General Electric Company, Schenectady, N.Y.

[22] Filed: Feb. 26, 1975

[21] Appl. No.: 553,177

Related U.S. Application Data

[63] Continuation of Ser. No. 411,005, Oct. 30, 1973, abandoned.

[52] U.S. Cl. ................................. 357/39; 357/37; 357/38; 357/60; 148/1.5; 357/89; 357/90
[51] Int. Cl.² .................. H01L 29/04; H01L 29/74; H01L 29/747; H01L 7/00
[58] Field of Search .................... 357/39, 60, 89, 90

[56] References Cited
UNITED STATES PATENTS
3,711,325  1/1973  Hentzschel ............................ 357/39

*Primary Examiner*—Edward J. Wojciechowicz
*Attorney, Agent, or Firm*—Donald M. Winegar; Joseph T. Cohen; Jerome C. Squillaro

[57] ABSTRACT

A deep diode bilateral semiconductor switch has a lamellar body of single crystal semiconductor material of at least five alternate first and second regions of different and opposite type conductivity. The second regions are made from recrystallized semiconductor material of the first regions having solid solubility of metal therein to impart thereto the opposite type conductivity and selective resistivity. The bilateral semiconductor switch conducts current in either direction.

26 Claims, 8 Drawing Figures

3,988,760

DEEP DIODE BILATERAL SEMICONDUCTOR SWITCH

This is a continuation of application Ser. No. 411,005, filed Oct. 30, 1973, now abandoned.

BACKGROUND OF THE INVENTION

1. Field of the Invention

This invention relates to bilateral semiconductor switches and a method of making the same.

2. Description of the Prior Art

A bilateral semiconductor switch may be produced by several different P-N junction-forming techniques. Suitable techniques include alloying, diffusion and epitaxial growth. Diffusion and alloying have proved to be the most popular techniques because they lend themselves to the economical mass production of bilateral switches. However, both techniques result in P-N junctions which are not very sharply defined although they may meet the requirement of a "step" P-N junction. Also, the width of the P-N junction varies with the process temperature employed. In addition, the diffusion process results in a region having non-uniform impurity concentration throughout the region.

The material of regions formed by alloying techniques is recrystallized material. These regions are limited in depth and area covered because the alloying process requires the formation of a molten mixture of the semiconductor material and either a donor or an acceptor material as the impurity material and subsequent solidification of the same to form the desired region. Moreover, it is very difficult to control the exact depth of an alloyed junction because the amount of molten mixture that is formed on alloying is a function of both the absolute temperature and the amount of metal-rich component placed on the semiconductor to form the alloy. In addition, the molten material must be prevented from flowing outside of a confined area otherwise the device may be inoperable. Usually, the process is limited to that portion of the device immediately adjacent to an electrical contact. Thus, most often, the alloying process is practiced when an electrical contact is affixed to the device.

In either case, the diffusion and alloying techniques are practiced only through a surface area and form regions therein which are only adjacent to the major surfaces involved. Because of the elapsed time and high temperature required for the diffusion process, the regions produced are limited in size. Any additional high temperature processing of the processed body readily affects the P-N junctions which have been previously formed and tends to enlarge the different regions and alter the configuration of the P-N junction.

Epitaxial growth techniques overcome some of the difficulties encountered by the diffusion and alloying techniques. Regions of fairly uniform resistivity are easily grown. However, the temperatures and the rate of growth of material are factors which limit the thickness of a region that can be grown economically. The P-N junction which results from epitaxial growth techniques is more sharply defined than the junctions made by alloying and diffusion.

In all instances, however, theoretical breakdown voltages and operating characteristics are not achieved. High temperatures for extended periods of time adversely affect the crystalline perfection of the substrate material. It also causes the P-N junction already present in the processed material to move and may also result in the out diffusion of dopant impurities thereby changing the resistivity of the region or regions of semiconductor material involved. Additionally, the processes deposit impurities within or on surfaces of the regions and at P-N junctions formed by the epitaxial process thereby detrimentally affecting the operating characteristics of the devices.

None of the bilateral semiconductor switches manufactured to date have several regions made from recrystallized substrate material. In addition, the bilateral semiconductor switches have usually been limited to five regions for bidirectional switching applications. Such structural limitations have resulted from extensive process time and high process temperatures encountered in making the devices.

An object of this invention is to provide a new and improved bilateral semiconductor switch which overcomes the deficiencies of prior art switches.

Another object of this invention is to provide a new and improved bilateral semiconductor switch wherein selected alternate regions of opposite type conductivity having a substantially constant uniform dopant impurity concentration throughout the selected regions are formed from recrystallized regions of the substrate.

Another object of this invention is to provide a new and improved bilateral semiconductor switch wherein the P-N junctions formed therein are well defined step P-N junctions.

Other objects of this invention will, in part, be obvious and will, in part, appear hereinafter.

BRIEF DESCRIPTION OF THE INVENTION

In accordance with the teachings of this invention, there is provided a bilateral semiconductor switch comprising a lamellar body of single crystal semiconductor material having two major opposed surfaces and at least five abutting regions of alternate and opposite type conductivity. The first, third and fifth regions of each group are of a first type conductivity and a selected resistivity. Each one of the first region and the fifth region has a selected surface area which is coextensive with one of the major surfaces of the device. The second and fourth regions have material which is recrystallized semiconductor material of the body having solid solubility of a metal therein, the concentration of which is sufficient to impart to the second and fourth regions the second and opposite type conductivity and selected resistivity. Each one of the second region and the fourth region has a selected surface area which is coextensive with one of the two major opposed surfaces of the body and the selected surface area of the respective first and fifth regions. A P-N junction is formed by the contiguous surfaces of abutting regions of opposite type conductivity. Electrical contacts are affixed to each one of the two major opposed surfaces and the respective pairs of first and second and fourth and fifth regions which are coextensive therein. An alternate embodiment of this bilateral semiconductor switch comprises two or more integral groups of five abutting regions. A P-N junction is formed by the contiguous surfaces of regions of opposite type conductivity of mutually adjacent groups.

DESCRIPTION OF THE INVENTION

Figure 1:
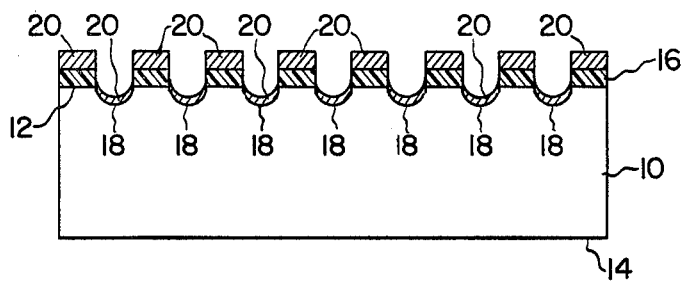
FIGS. 1, 2 and 3 are elevation views, in cross-section, of a body of semiconductor material processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a compound of a Group II element and a Group VI element and a compound of a Group III and a Group V element.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80° C. A suitable mask of an array of spaced lines of a predetermined width and spaced a predetermined distance apart is disposed on the layer of photoresist and exposed to ultraviolet light. After exposure, the layer of photoresist is washed in Xylene to open windows in the mask where the lines are desired so as to be able to selectively etch the silicon oxide layer 16 exposed in the windows.

The lines in the mask may each be of the same width or of a different width depending upon the design of the switching device to be made. Additionally, the operating characteristics of the switching device determines the distance between the center lines of the adjacent lines in the mask.

Selective etching of the layer 16 of silicon oxide is accomplished with a buffered hydrofluoric acid solution ($NH_4F$-HF). The etching is continued until a second set of windows corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a mixture of 1 part by volume hydrogen peroxide and 1 part by volume concentrated sulphuric acid.

Selective etching of the exposed surface area of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° C to 30° C, the mixed solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25° C will result in a trough 18 of from 25 to 30 microns in depth for a window width of from 10 to 500 microns. The etched body 10 is rinsed in distilled water and blown dry. Preferably, a gas such, for example as, freon, argon and the like, is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by one or more materials to impart a second and opposite type conductivity to the material of the body 10 through which it migrates. The thickness of the layer 20 is approximately equal to the depth of the trough 18. Therefore, if the trough 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding the excess metal with a 600 grit carbide paper.

It has been discovered that the vapor deposition of the layer 20 of aluminum metal should be performed at a pressure of approximately $1 \times 10^{-5}$ torr but not greater than $5 \times 10^{-5}$. When the pressure is greater than $5 \times 10^{-5}$ torr, we have found that in the case of aluminum metal vapor deposited in the troughs 18, the aluminum does not penetrate into the silicon and migrate through the body 10. It is believed that the layer of aluminum is saturated with oxygen and prevents reduction by the aluminum metal of the very thin silicon oxide layer between the deposited aluminum and the silicon that was formed in the air shortly after etching the troughs 18. Thus, the initial melt of aluminum and silicon required for migration is not obtained because of the inability of aluminum to wet the silicon interface. In a like manner, aluminum deposited by sputtering is not desirable as the aluminum appears to be saturated with oxygen from the process, thereby preventing the reduction of any intervening silicon oxide. The preferred methods of depositing aluminum on the silicon body 10 are by the electron beam method and the like wherein little if any oxygen can be trapped in the aluminum.

The processed body 10 is placed in a thermomigration apparatus, not shown, and the metal wires in the troughs 18 are migrated through the body 10 by a thermal gradient zone melting process. A thermal gradient of approximately 50° C per centimeter between the bottom surface 14, which is the hot face and the surface 12, which is the cold face, has been discovered to be appropriate at an apparatus operating temperature of from 800° C to 1400° C. The process is practiced for a sufficient length of time to migrate all the metal wires through the body 10. For example, for aluminum wires of 20 microns thickness, a thermal gradient of 50° C/cm, a 1200° C mean temperature of body 10, a pressure of $1 \times 10^{-5}$ torr, and a furnace time of less than 12 hours is required to migrate the wires through a silicon body 10 of 1 centimeter thickness.

The temperature gradient zone melting process and apparatus therefore is not part of this invention. For a more thorough understanding of the temperature gradient zone melting process employed in this invention and for a more thorough description of the apparatus employed for the process, one is directed to our copending applications entitled Method of Making Deep Diode Devices, Ser. No. 411,150; Deep Diode Device Production and Method, Ser. No. 411,021; Deep Diode Devices and Method and Apparatus, Ser. No. 411,001; High Velocity Thermomigration Method of Making Deep Diodes, Ser. No. 411,015; Deep Diode Device Having Dislocation-Free P-N Junctions and Method, Ser. No. 411,009; and The Stabilized Droplet Method of Making Deep Diodes Having Uniform Electrical Properties, Ser. No. 411,008. A more thorough discussion of which crystallographic planes are preferred for disposing the metal wires thereupon and the preferred crystal axis for migration shall be found in our copending application entitled Deep Diode Line Migration, Ser. No. 411,018, being filed concurrently with this parent application and assigned to the same assignee of this invention.

Figure 2:
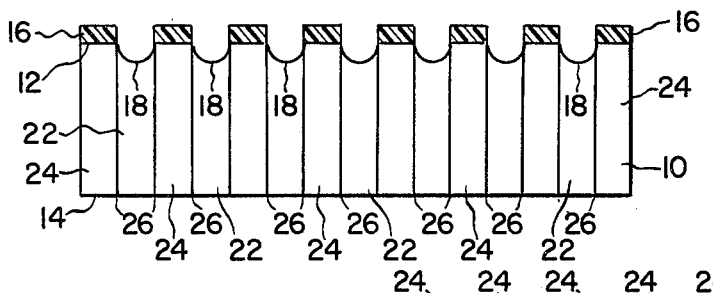

Upon completion of the temperature gradient zone melting process, the resulting processed body 10 is as shown in FIG. 2. The thermal migration of the metal wires in the troughs 18 through the body 10 produces a body 10 having a plurality of first spaced regions 22 of a second and opposite type conductivity than the body 10. Each region is recrystallized material of the body 10 suitably doped with a material comprising the metal wire and having an impurity concentration sufficient to obtain the desired conductivity. The metal retained in the recrystallized region is substantially the maximum allowed by the solid solubility of the metal in the semiconductor material through which it has been thermomigrated. It is recrystallized material having solid solubility of the metal therein. The region 22 has substantially a constant uniform level of impurity concentration throughout the entire planar region. The concentration of impurity is determined by the slope of the solid solubility curve in the operating furnace temperature range. The thickness of the region 22 is substantially constant for the entire region. The peripheral surface of each planar region 22 comprises in part the top surface 12, the bottom surface 14, and the peripheral side surface of the body 10.

Additionally, the body 10 is divided into a plurality of spaced regions 24 having the same, or first, type conductivity as the body 10. A P-N junction 26 is formed by the contiguous surfaces of each pair of mutually adjacent regions 22 and 24 of opposite type conductivity. The P-N junction 26, as formed, is very abrupt and distinct resulting in a step junction. Each P-N junction is approximately 18 microns in thickness when the migration temperature is approximately 1050° C and 0.3 microns when the furnace temperature is about 900° C.

Figure 3:
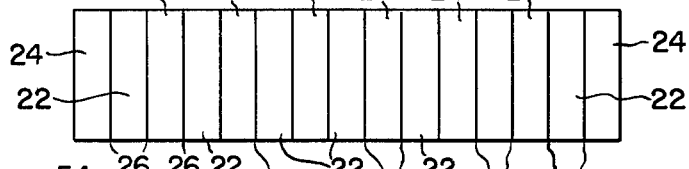

The resulting structure is a lamellar body of at least one group of four alternate regions, 24 and 22 respectively, of opposite type conductivity as shown in FIG. 3. Each region 22 and 24 is substantially a planar region. The structure may also be divided into a plurality of chips having a similar configuration.

Figure 4:
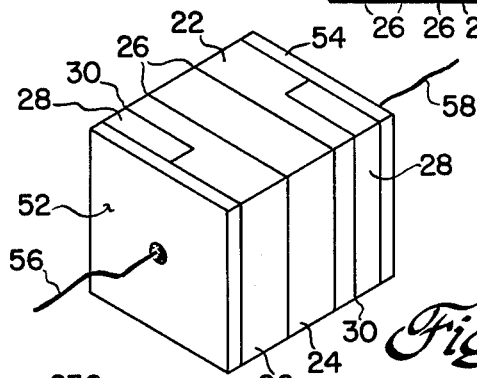
FIG. 4 is an isometric view of a bilateral switch made in accordance with the teachings of this invention.

Referring now to FIG. 4, there is shown a bilateral semiconductor switch 50 embodying the basic structure of the processed body 10 as a 5-region switching device. The switch 50 has five abutting regions of alternate and opposite type conductivity. A P-N junction 26 is formed by the contiguous surfaces of the substantially planar regions 22 and 24. The switch 50 is completed by either simultaneously diffusing N-type regions 28 into respective regions 22 or by thermomigrating metal wires comprising an N-type dopant impurity such, for example, as antimony, phosphorus and the like, by temperature gradient zone melting as described heretofore. A P-N junction 30 is formed by the contiguous surfaces of the abutting regions 22 and 28. An ohmic electrical contact 52 is affixed to selected surface areas of regions 22 and 28 and the exposed portion of the P-N junction 30 therebetween comprising one of two major opposed surfaces of the switch 50. An ohmic electrical contact 54 is affixed to selected surface areas of two other regions 22 and 28 and the exposed portion of the P-N junction 30 therebetween comprising the other of the two major opposed surfaces of the switch 50. Electrical leads 56 and 58 are affixed to the respective contacts 52 and 54 for connecting the switch 50 into an electrical circuit.

As shown in FIG. 4, the switch 50 is a bilateral diode switch. Each region 28 has a selected surface area which comprises substantially one-half of a major surface of the switch 50. The switch 50 is a symmetrical two-terminal switch. The switch 50 consists essentially of two P-N-P-N devices in parallel arrangement with each other but arranged in opposite order. In one of the ON states, one P-N-P-N device conducts current in one direction while the other P-N-P-N device does not conduct. However, with a reversal of applied potential polarity, the other P-N-P-N device now conducts while the other is non-conductive. Bilateral semiconductor switches of this type can be triggered by rapidly raising the applied voltage, by raising the applied voltage above the avalanche voltage of the blocking junction, or by increasing the junction temperature to a sufficiently high level.

The regions of recrystallized material exhibit substantially theoretical values for the materials used in making the regions. In addition, the temperature gradient zone melting process also functions as an inherent zone refining process and the quality of the resulting material of the region is actually better than the initial starting material of the body of semiconductor material. The resulting P-N junctions are well defined. The regions are substantially uniformly constant in their physical dimensions throughout. The level of impurity concentration is dependent upon the slope of the solid solubility curve for the particular metals, semiconductor materials involved and the temperature employed for thermomigration. For example, when aluminum is thermomigrated through a body of silicon, the concentration of aluminum is substantially constant throughout the region produced since the slope of the solid solubility curve of aluminum in silicon is so slight over the temperature range of practicing the temperature gradient zone melting process.

We have discovered that normally where the body of semiconductor material is a thin wafer of the order of 10 mil thickness, planar orientation of the surfaces 12 and 14 and wire directions are not too critical. However, to achieve best results on a repetitive basis, the thermomigration of metal wires is preferably practiced in accordance with the preferred planar orientations, thermomigration axis direction, stable wire directions and stable wire sizes as tabulated in Table I.

Table I

| Wafer Plane | Migration Direction | Stable Wire Directions | Stable Wire Sizes |
|---|---|---|---|
| (100) | $<100>$ | $<011>$* | 100 microns |
|  |  | $<0\bar{1}1>$* | 100 microns |
| (110) | $<110>$ | $<1\bar{1}0>$* | 150 microns |
| (111) | $<111>$ | a) $<01\bar{1}>$ |  |
|  |  | $<10\bar{1}>$ | 500 microns |
|  |  | $<1\bar{1}0>$ |  |
|  |  | b) $<11\bar{2}>$* |  |
|  |  | $<\bar{2}11>$* | 500 microns |
|  |  | $<1\bar{2}1>$* |  |
|  |  | c) Any other Direction in (111) plane | 500 microns |

*The stability of the migrating wire is sensitive to the alignment of the thermal gradient with the $<100>$, $<110>$ and $<111>$ axis, respectively.
+Group a is more stable than group b which is more stable than group c.

In addition, we have discovered that the thermomigration of metal wires, as well as droplets, need not be practiced only in a negative atmosphere. Thermal gradient zone melting can be successfully practiced in a postive inert gas atmosphere whether it is a wafer of the order of 10 mils or a piece of semiconductor material 1 centimeter or more in thickness. Suitable gases for the inert atmosphere are hydrogen, helium, argon and the like.

The regions 24 will also have specific characteristics for the type of bilateral switch desired. Therefore, it may be necessary that the widths and the electrical properties of the region be varied accordingly. Thermal gradient zone melting process may again be practiced to thermomigrate suitable metal wires embodying N-type dopants such, for example, as antimony, phosphorus and the like through the body 10 to produce the desired planar region. Care is exercised in the practice that the metal wire overlaps the adjacent P-type regions to assure one that no undesirable N-type semiconductor region inadvertently remains between the P-type regions and the desired N-type region which would detrimentally affect the operating characteristics of the switch.

Figure 5:
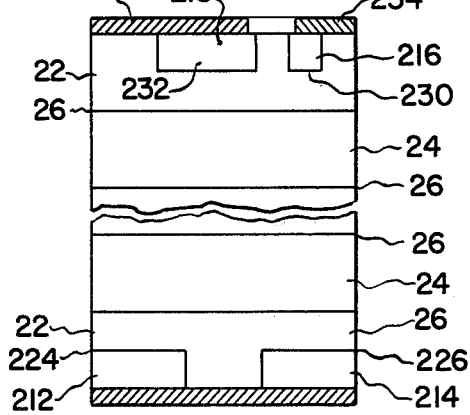
FIG. 5 is an elevation view, partly in cross-section, of an alternate embodiment of the bilateral semiconductor switch of FIG. 4.

The process of this invention for making a bilateral switch lends itself for making bilateral semiconductor switches which embody a plurality of integral bilateral switches formed in common in one body of semiconductor material. Referring now to FIG. 5 there is shown a bilateral semiconductor switch 110 which is an alternate embodiment of the switch 50. Those items denoted by the same reference numerals in both FIGS. 4 and 5, are the same as and function in the same manner as described heretofore. The switch 110 has increased capacity for voltage handling by increasing the number of regions 22 and 24 between the contacts 52 and 54. To accomplish this by prior art methods one would either have to employ tedious repetitive making, selective etching and diffusion processes or to stack individual switches 50 and provide external electrical circuits to provide simultaneous triggering of the same. By employing our method, one need only decide on the number of regions required and need make only one integral switch thereby eliminating the extra circuitry and extensive process times.

Figure 6:
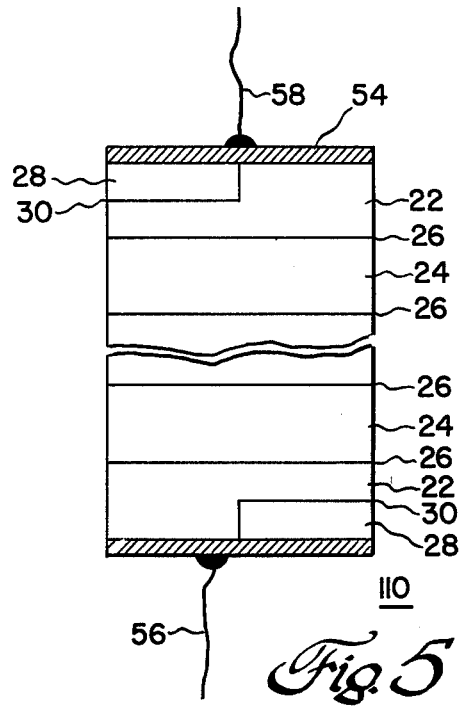
FIG. 6 is an elevation view, in cross-section of another alternate embodiment of the bilateral semiconductor switch of FIG. 4.

The design of the switches 50 and 110 may be altered as required to provide other bilateral semiconductor switch designs such, for example, as bilateral triode switches and the like. To illustrate such an example, one is directed to FIG. 6 which illustrates a bilateral tetrode switch 210 which may be triggered with either negative or positive gate pulses. Regions 22 and 24 and the P-N junctions 26 are formed by the previously described temperature gradient zone melting process embodying the thermomigration of suitable metal wires to produce the required conductivity types and desired resistivities for each of the regions. N-type regions 212, 214, 216 and 218 may be formed by single or double diffusion or by thermomigration of metal wires. An ohmic electrical contact 220 is affixed simultaneously to regions 22, 212 and 214 of the switch 210. Each of the regions 22, 212 and 214 have selected surface areas which are coextensive with a major surface 222 of the switch 210. P-N junctions 224 and 226 are formed by the contiguous surfaces of the respective pairs of regions 212 and 22 and 214 and 22 of opposite type conductivity.

Regions 22, 216 and 218 have selected surface areas which are coextensive with a major surface 228 of the switch 210. Surfaces 222 and 228 are opposed major surfaces of the switch 210. P-N junctions 230 and 232 are formed by the contiguous surfaces of the respective pairs of regions 216 and 22 and 218 and 22 of opposite type conductivity. An ohmic electrical contact 234 is affixed simultaneously to selected surface areas of the regions 216 and 22 and functions as gate electrode. An ohmic electrical contact 236 is affixed simultaneously to regions 218 and 22.

The switch 210 can be triggered into conduction in either direction by the application of a low-voltage, low current pulse between the gate contact and the adjacent load-current terminal. The switch 210 conducts on both alternations of an a-c current therefore, only one heat sink is required, and the trigger circuitry can be simplified, as compared to that circuitry required for two semiconductor controlled rectifiers connected in parallel but in opposite directions.

Figure 7:
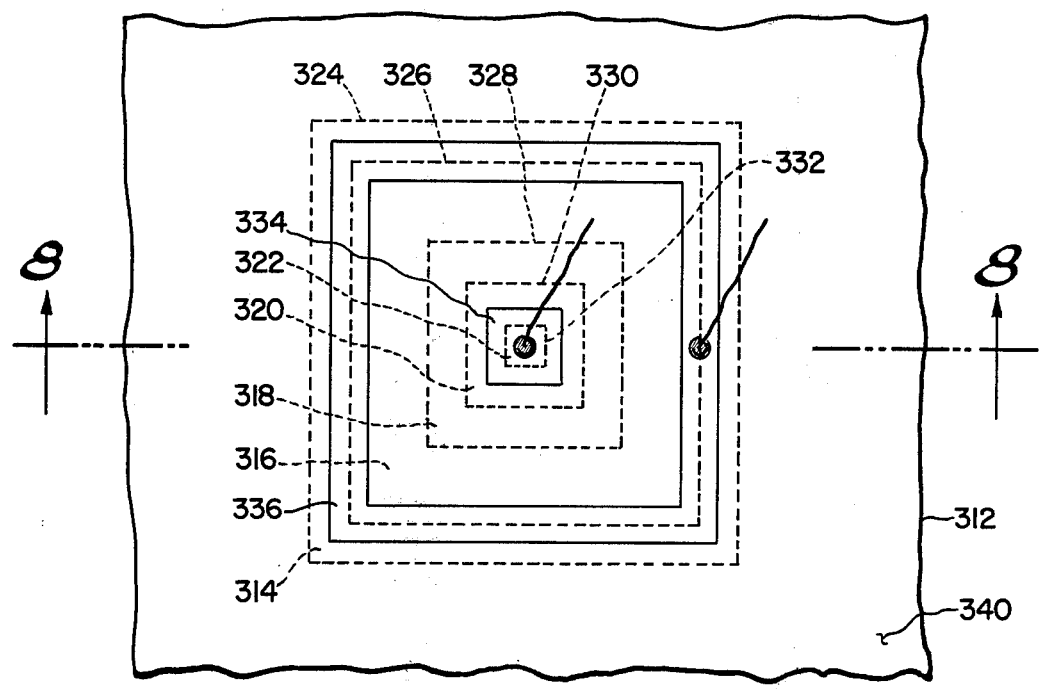
FIG. 7 is a top plannar elevation view of a bilateral semiconductor switch for integrated circuits made in accordance with the teachings of this invention.
Figure 8:
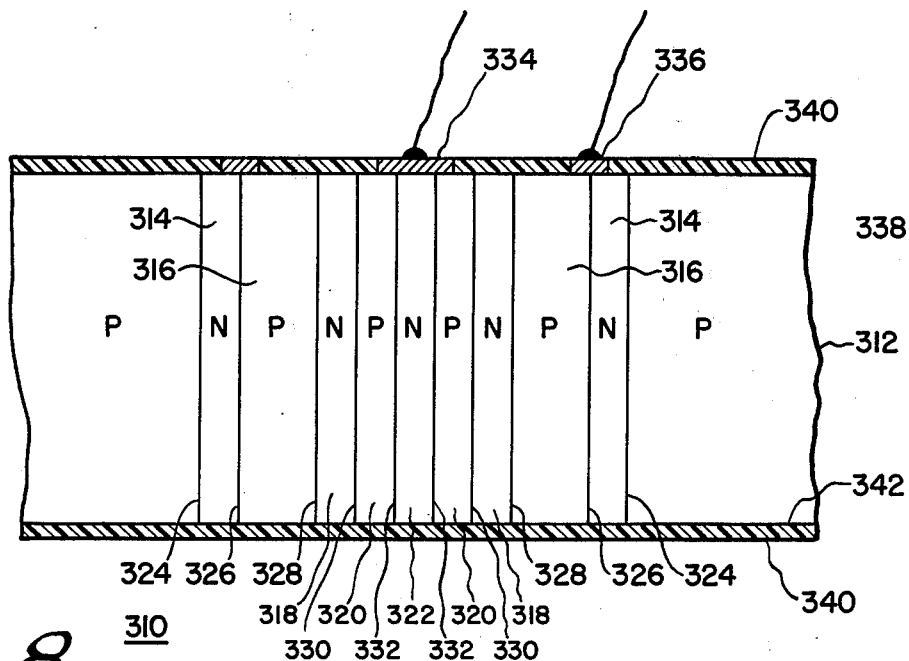
FIG. 8 is an elevation view, in cross-section, of the switch of FIG. 7 taken along the cutting plane VIII—VIII.

The bilateral semiconductor switch of the invention is readily adaptable for use in integrated circuits. Referring now to FIGS. 7 and 8 there is shown a bilateral switch 310 formed in a substrate 312 of semiconductor material. Should the substrate be of P-type conductivity, no electrical isolation region is needed to electrically isolate the switch 310 from the remainder of the circuits. The switch 310 comprises concentric regions 314, 316, 318, 320 and 322 of alternate N and P-type conductivities. P-N junctions 324, 326, 328, 330 and 332 are formed by the respective abutting regions 312 and 314, 314 and 316, 316 and 318, 318 and 320, and 320 and 322 of opposite type conductivity. An ohmic electrical contact 334 is affixed simultaneously to selected surface areas of the regions 320 and 322 and the exposed portion of the P-N junction 332 therebetween. An ohmic electrical contact 336 is affixed simultaneously to selected surface areas of regions 314 and 316 and the exposed P-N junction 326 therebetween.

Any or all of the regions 314 through 322 is formed by practicing the thermomigration of suitable metal wires through the substrate or body 312 in the same manner as described heretofore relative to making the switches 50, 110 and 210. Each region may be formed simultaneously by judicious selection of wire directions and planar orientation of the surface 338 of the substrate 312. For a more detailed description of the simultaneous thermomigration of intersecting metal wires to form intersecting planar regions one is directed to our copending patent application "Thermomigration of Metal-Wires", Ser. No. 411,018; filed on the same day as the patent application and assigned to the same assignee as this invention.

Preferably, the region 322 may be formed by the thermomigration of a metal droplet through the substrate 312. It has been discovered that when the body or substrate 312 is of silicon, germanium, silicon carbide, gallium, arsenide semiconductor material and the like, the migrating metal droplet has a preferred shape which also gives use to the region 322 being of the same shape as a cross-section of the migrating droplet. In a crystal axis direction of < 111 > of thermal migration, the droplet migrates as a triangular platelet laying in a (111) plane. The platelet is bounded on its edges by (112) planes. A droplet larger than 0.10 centimeter on an edge is unsatable and breaks up into several droplets during migration. A droplet less than 0.0175 centimeter does not migrate into the body 312 because of a surface barrier problem.

The ratio of the droplet migration rate over the imposed thermal gradient is a function of the temperature at which thermomigration of the droplet 22 is practiced. At high temperatures, of the order of from 1000° C to 1400° C, the droplet migration velocity increases rapidly with increasing temperature. A velocity of 10 centimeters per day or $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

A droplet thermomigrates in the < 100 > crystal axis direction as a pyramidal bounded by four forward (111) planes and a rear (100) plane. Careful control of the thermal gradient and migration rate is a necessity. Otherwise, a twisted region 322 may result. It appears that there is a nonuniform dissolution of the four forward (111) facets in that they do not always dissolve at a uniform rate. Non-uniform dissolution of the four forward (111) facets may cause the regular pyramidal shape of the droplet to become distorted into a trapezoidal shape. Therefore, to form the region 322 as shown, the preferred planar orientation for the surface 338 is (100).

A layer 340 of electrically insulating material, such for example as, silicon oxide, silicon nitride, aluminum oxide and the like is disposed on the opposed major surfaces 338 and 342 to preserve the integrity of the exposed portions of the P-N junctions and the switch 310.

We claim as our invention:

1. In a bilateral semiconductor switch comprising a lamellar body of single crystal semiconductor material having two opposed major surfaces and embodying at least five regions of alternate and opposite type conductivity, a P-N junction formed by the contiguous surfaces of each pair of regions of opposite type conductivity, at least two regions of opposite type conductivity having coextensive surfaces comprising one of the two opposed major surfaces and the P-N junction formed therebetween having at least one end portion terminating in the major surface and another portion thereof disposed substantially parallel to the two major opposed surfaces, at least two other regions of opposite type conductivity having coextensive surfaces comprising the other of the major surfaces and the P-N junction formed therebetween having at least one end portion terminating in the other of the major surfaces and another portion thereof disposed substantially parallel to the two major opposed surfaces, a first electrical contact affixed to one major surface and in ohmic electrical contact with the at least two regions of opposite type conductivity and the end portion of the P-N junction exposed therein and a second electrical contact affixed to the other major surface and in ohmic electrical contact with the other at least two regions of opposite type conductivity and the end portion of the junction exposed therein, the improvement consisting of:

the body has a preferred crystallographic structure;
a side surface of the body has a preferred planar crystal orientation which is one selected from the group consisting of (100), (110) and (111);
at least one of the regions consists of recrystallized semiconductor material of the body formed in situ by the thermal migration of a melt of a metal-rich semiconductor material of the body by thermal gradient zone melting at a predetermined elevated temperature along a thermal gradient substantially parallel with a first preferred crystal axis of the material of the body and the region and has a predetermined level of concentration of the metal of the melt as determined by the solid solubility limit of that metal in that semiconductor material at that predetermined elevated temperature of migration and the metal is distributed substantially uniformly throughout the entire region;
the metal including at least one dopant impurity material to impart a predetermined type conductivity and a predetermined level of resistivity to the at least one region;
the at least one region is oriented substantially parallel with a second preferred crystal axis, and
the at least one region of recrystallized semiconductor material having a substantially constant level of resistivity throughout the region.

2. The semiconductor device of claim 1 wherein the semiconductor material is one selected from the group consisting of silicon, silicon carbide, gallium arsenide and germanium.

3. The semiconductor device of claim 2 wherein the semiconductor material is silicon, and the dopant metal is aluminum.

4. The semiconductor device of claim 1 including at least one additional pair of abutting regions of opposite type conductivity and a P-N junction formed therebetween disposed between the first and second regions and the fourth and fifth regions of opposite type conductivity to provide a device having at least seven integral abutting regions of alternate and opposite type conductivity.

5. The bilateral semiconductor switch of claim 1 wherein the first, third and fifth regions are of a first type conductivity, the material of the second and fourth regions each region is formed in situ by thermal gradient zone melting and consists of recrystallized semiconductor material of the body and the dopant material therein imparts a second type conductivity thereto.

6. The semiconductor device of claim 5 wherein the semiconductor material is one selected from the group consisting of silicon, silicon carbide, gallium arsenide and germanium.

7. The semiconductor device of claim 6 wherein the semiconductor material is silicon, and the dopant impurity material is aluminum.

8. The semiconductor device of claim 5 including at least one additional pair of abutting regions of opposite type conductivity and a P-N junction formed therebetween disposed between the third region and the fourth and fifth regions of opposite type conductivity and in abutting contact therewith to provide a device having at least seven integral abutting regions of alternate and opposite type conductivity.

9. The bilateral semiconductor switch of claim 5 wherein
the first region is oriented with respect to the second region so as to encompass a portion thereof that embodies that portion of the second region having the surface coextensive with the surface of the first region to comprise a major surface of the body, and including
a sixth region of first type conductivity disposed in the fourth region and spaced from the fifth region, the sixth region having a surface coextensive with the surfaces of the fourth and fifth regions comprising the other of the major surfaces;
a P-N junction formed by the contiguous abutting surfaces of the material of the fourth and sixth regions of opposite type conductivity, the junction having at least one end portion terminating in the other of the major surfaces and another portion substantially parallel to the two opposed major surfaces, and
a third electrical contact affixed to the other of the major surfaces spaced from the second electrical contact, and in an ohmic electrical contact with the fourth and sixth regions and the end portion of the P-N junction exposed thereat.

10. The semiconductor device of claim 9 wherein the semiconductor material is one selected from the group consisting of silicon, silicon carbide, gallium arsenide and germanium.

11. The semiconductor device of claim 10 wherein the semiconductor material is silicon, and the dopant impurity material is aluminum.

12. The semiconductor device of claim 9 including at least one additional pair of abutting regions of opposite type conductivity and a P-N junction formed therebetween disposed between the third region and the fourth and fifth regions of opposite type conductivity and in an abutting contact relationship therewith to provide a device having at least seven integral abutting regions of alternate and opposite type conductivity.

13. The bilateral semiconductor switch of claim 1 wherein
the preferred planar orientation of the side surface is (100),
the first preferred crystal axis is <100>, and
the second preferred axis is one selected from the group consisting of <011> and <01$\bar{1}$>.

14. The bilateral semiconductor switch of claim 1 wherein the preferred planar orientation of the side surface is (110),
the first preferred crystal axis is <110>, and
the second preferred crystal axis is <1$\bar{1}$0>.

15. The bilateral semiconductor switch of claim 1 wherein
the preferred planar orientation of the side surface is (111), and
the first preferred crystal axis is <111>.

16. The bilateral semiconductor switch of claim 15 wherein
the second preferred crystal axis is one selected from the group consisting of <11$\bar{2}$>, <$\bar{2}$11>, <1$\bar{2}$1>, <01$\bar{1}$>, <10$\bar{1}$> and <1$\bar{1}$0>.

17. A bilateral semiconductor switch comprising
a body of single crystal semiconductor material having a first type conductivity, a predetermined level of resistivity and two major opposed surfaces, at least one of which has a preferred planar crystal orientation which is one selected from the group consisting of (100), (110) and (111);
a first column-like region disposed in the body substantially perpendicular to the surface of preferred planar crystal orientation and extending between and terminating in the two opposed major surfaces and the first region consisting of recrystallized semiconductor material of the body formed in situ in the body by the migration of a melt of metal-rich semiconductor material of the body by thermal gradient zone melting at a predetermined elevated temperature along a thermal gradient substantially parallel with a first preferred crystal axis of the region and has a predetermined level of concentration of the metal of the melt as determined by the solid solubility limit of that metal in that semiconductor material at that predetermined elevated temperature of migration and the metal is distributed substantially uniformly throughout the entire region, the metal including at least one dopant impurity material to impart a predetermined level of resistivity and a predetermined type conductivity to the region so formed;
four concentric abutting regions of alternate first and second type conductivity and a selected level of resistivity, each having a rectangular-like planar configuration encompassing, and in abutting contact relationship with each other and the first region, each of the four regions extending substantially perpendicular to the surface of preferred planar orientation between, and terminating in, the two major opposed surfaces and having a vertical axis aligned substantially parallel with a first preferred crystal axis,
each rectangular region consisting of two pair of planar regions, aligned substantially parallel with each other, each planar region of one pair being substantially perpendicular to, and integral with a planar region of the other pair, each region of one pair being aligned substantially parallel with a second preferred crystal axis the material of the body, and each region of the other pair being aligned substantially parallel with a third preferred axis of the material of the body;
the second and fourth regions having a first type conductivity;
the third and fifth regions having a second type conductivity;

a P-N junction formed by the contiguous surfaces of each pair of abutting regions of opposite type conductivity and at least one end portion is exposed in the major surface of preferred planar orientation;

a first ohmic electrical contact affixed simultaneously to a selected surface area of the first and second region and the exposed end portion of the P-N junction formed therebetween, and a second ohmic electrical contact affixed simultaneously to a selected surface area of the fourth and fifth regions and the exposed end portion of the P-N junction formed therebetween.

18. The bilateral semiconductor device of claim 17 wherein
the material of each of the at least the third and fifth regions consists of recrystallized semiconductor material of the body having solid solubility of a dopant impurity material therein to impart the predetermined second type conductivity and predetermined level of resistivity thereto, the third and fifth regions each being formed in situ by thermal gradient zone melting in a manner similar to that of the first region.

19. The semiconductor device of claim 18 wherein semiconductor material is one selected from the group consisting of silicon, silicon carbide, gallium arsenide and germanium.

20. The semiconductor device of claim 19 wherein the semiconductor material is silicon, and
the dopant impurity material is aluminum.

21. The bilateral semiconductor switch of claim 18 wherein
the preferred planar orientation of the major surface is (100).

22. The semiconductor device of claim 21 wherein
the semiconductor material is one selected from the group consisting of silicon, silicon carbide, gallium arsenide and germanium.

23. The semiconductor device of claim 22 wherein
the semiconductor material is silicon, and
the dopant impurity material is aluminum.

24. The bilateral semiconductor switch of claim 21 wherein
the first preferred crystal axis is <100>,
the second preferred crystal axis is <011>, and
the third preferred crystal axis is <0$\bar{1}$1>.

25. The bilateral semiconductor switch of claim 18 wherein
the preferred planar crystal orientation is (111), and
the first preferred crystal axis is <111>.

26. The bilateral semiconductor switch of claim 25 wherein
the second preferred crystal axis is one selected from the group consisting of <01$\bar{1}$>, <10$\bar{1}$>, <1$\bar{1}$0>, <11$\bar{2}$>, <$\bar{2}$11> and <1$\bar{2}$1>, and
the third preferred crystal axis is any crystal axis perpendicular to both the first and the second preferred crystal axes.

* * * * *